United States Patent
Cho et al.

(10) Patent No.: US 11,417,277 B2
(45) Date of Patent: Aug. 16, 2022

(54) DISPLAY DEVICE

(71) Applicant: Samsung Display Co., Ltd., Yongin-si (KR)

(72) Inventors: Daeyoun Cho, Yongin-si (KR); Jongwoo Park, Yongin-si (KR); Eugene Kim, Yongin-si (KR); Youngtae Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/096,388

(22) Filed: Nov. 12, 2020

(65) Prior Publication Data

US 2021/0201795 A1     Jul. 1, 2021

(30) Foreign Application Priority Data

Dec. 30, 2019   (KR) .................. 10-2019-0178503

(51) Int. Cl.
| | | |
|---|---|---|
| *H01L 51/52* | (2006.01) | |
| *G09G 3/3258* | (2016.01) | |
| *H01L 27/32* | (2006.01) | |

(52) U.S. Cl.
CPC ....... *G09G 3/3258* (2013.01); *H01L 27/3258* (2013.01); *H01L 27/3276* (2013.01)

(58) Field of Classification Search
CPC ......... G02F 1/133512; G02F 1/133553; G02F 1/133616; G02F 1/133618; G02F 1/136209; G02F 1/136218; G02F 1/19; G02F 2201/38; G02F 1/133345; G02F 1/13454; G02F 2203/02; G02F 1/133502; G06F 2203/04112; G09G 2320/0626; G09G 2300/0426; G09G 3/3233; G09G 3/3258; H01L 27/3258; H01L 27/3276; H01L 27/12; H01L 27/124; H01L 51/5284; H01L 51/5218; H01L 51/5221; H01L 51/5256

See application file for complete search history.

(56) References Cited

U.S. PATENT DOCUMENTS

| | | | |
|---|---|---|---|
| 6,639,639 B2 | 10/2003 | Baek et al. | |
| 10,139,673 B2 * | 11/2018 | Park | ............... G02F 1/1368 |
| 10,490,119 B2 | 11/2019 | Kim et al. | |
| 2019/0074344 A1 * | 3/2019 | Ka | ............... H01L 27/3265 |

(Continued)

FOREIGN PATENT DOCUMENTS

| | | |
|---|---|---|
| KR | 10-0641628 | 11/2006 |
| KR | 10-2008-0032834 | 4/2008 |

(Continued)

*Primary Examiner* — Duc Q Dinh
(74) *Attorney, Agent, or Firm* — Kile Park Reed & Houtteman PLLC

(57) ABSTRACT

A display device includes a substrate including a display area and a non-display area adjacent to the display area, a pixel disposed in the display area, a first voltage line disposed in the non-display area and supplying a first power supply voltage to the pixel, a second voltage line disposed in the non-display area and supplying a second power supply voltage to the pixel, the second voltage line being apart from the first voltage line, and a metallic pattern disposed between the first voltage line and the second voltage line. A shortest distance between the first voltage line and the second voltage line is greater than a width of the metallic pattern.

20 Claims, 9 Drawing Sheets

(56) References Cited

U.S. PATENT DOCUMENTS

| | | |
|---|---|---|
| 2019/0229176 A1 | 7/2019 | Shim et al. |
| 2019/0288234 A1* | 9/2019 | Kim .................... H01L 27/3276 |
| 2019/0348491 A1* | 11/2019 | Chung ................. G09G 3/3233 |
| 2019/0393295 A1* | 12/2019 | Moy ................... H01L 27/3279 |

FOREIGN PATENT DOCUMENTS

| | | |
|---|---|---|
| KR | 10-1121120 | 3/2012 |
| KR | 10-2016-0140208 | 12/2016 |
| KR | 10-2017-0080144 | 7/2017 |
| KR | 10-2018-0033373 | 4/2018 |
| KR | 10-2019-0090111 | 8/2019 |

\* cited by examiner

DISPLAY DEVICE

CROSS-REFERENCE TO RELATED APPLICATION

This application claims priority to and benefits of Korean Patent Application No. 10-2019-0178503 under 35 U.S.C. § 119, filed in the Korean Intellectual Property Office on Dec. 30, 2019, the entire contents of which are incorporated herein by reference.

BACKGROUND

1. Technical Field

One or more embodiments relate to a display device.

2. Description of the Related Art

Mobile display devices are widely used. Tablet personal computers (PCs), in addition to small electronic devices, such as mobile phones, are widely used as mobile display devices.

These mobile display devices support a variety of functions. Display devices may include a display area to provide visual information, such as an image or a video, to a user. As the size of components of display devices, such as components for driving a display device, decreases, display area of display devices increases. Further developed is a display structure in that a display device can be bent with a certain angle from a flat state.

High brightness display devices for realizing a brighter screen have been developed so that visibility is enhanced even in an outdoor environment having a high external light amount.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may relate to a display device in which a brighter screen may be realized so that visibility may be enhanced even in an outdoor environment having a high external light amount, and sparkles caused by external light or external light reflection in a non-display area adjacent to a display area may be minimized.

Additional aspects will be set forth in part in the description which follows and, in part, will be apparent from the description, or may be learned by practice of the presented embodiments of the disclosure.

According to one or more embodiments, a display device may include a substrate including a display area and a non-display area adjacent to the display area, a pixel disposed in the display area, a first voltage line disposed in the non-display area and supplying a first power supply voltage to the pixel. The display device may include a second voltage line disposed in the non-display area and supplying a second power supply voltage to the pixel, the second voltage line being apart from the first voltage line, and a metallic pattern disposed between the first voltage line and the second voltage line. A shortest distance between the first voltage line and the second voltage line may be greater than a width of the metallic pattern.

A distance between the first voltage line and the metallic pattern may be about 1 µm to about 50 µm.

A distance between the second voltage line and the metallic pattern may be about 1 µm to about 50 µm.

At least part of the first voltage line may overlap a first virtual line parallel with a side of the display area, and the second voltage line may surround at least part of the display area.

A width of the first voltage line may be less than a width of the second voltage line.

The first voltage line may be electrically connected to a first driving voltage line in a first direction in the display area and a second driving voltage line in a second direction crossing the first driving voltage line.

The first voltage line may include a first lower voltage line and a first upper voltage line on the first lower voltage line.

The metallic pattern and the first lower voltage line or the first upper voltage line may be disposed on a same layer.

The metallic pattern may include a lower metallic pattern and an upper metallic pattern, the lower metallic pattern and the first lower voltage line may be disposed on a same layer, and the upper metallic pattern and the first upper voltage line may be disposed on a same layer.

The first lower voltage line and the first upper voltage line may be electrically connected to each other via a contact hole of an insulating layer between the first lower voltage line and the first upper voltage line.

The display device may further include a cover film in the non-display area.

The cover film may overlap the first voltage line or the second voltage line.

The cover film may be apart from the metallic pattern in a direction in which the cover film is disposed from the display area.

The metallic pattern may be disposed between the cover film and the display area.

The first voltage line or the second voltage line may include holes.

According to one or more embodiments, a display device may include a substrate including a display area and a non-display area adjacent to the display area, a cover film in the non-display area, a pixel disposed in the display area, a first voltage line disposed between the substrate and the cover film and electrically connected to the pixel, wherein at least part of the first voltage line may overlap a first virtual line parallel with a side of the display area, a second voltage line disposed between the substrate and the cover film and electrically connected to the pixel, the second voltage line being apart from the first voltage line, and a metallic pattern disposed between the first voltage line and the second voltage line, wherein the metallic pattern may be disposed along the first virtual line.

The metallic pattern may be disposed between the display area and the cover film.

A distance between the first voltage line or the second voltage line and the metallic pattern may be about 1 µm to about 50 µm.

The second voltage line may extend along outer portions of the display area.

A width of the first voltage line may be less than a width of the second voltage line.

The first voltage line or the second voltage line may include holes.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
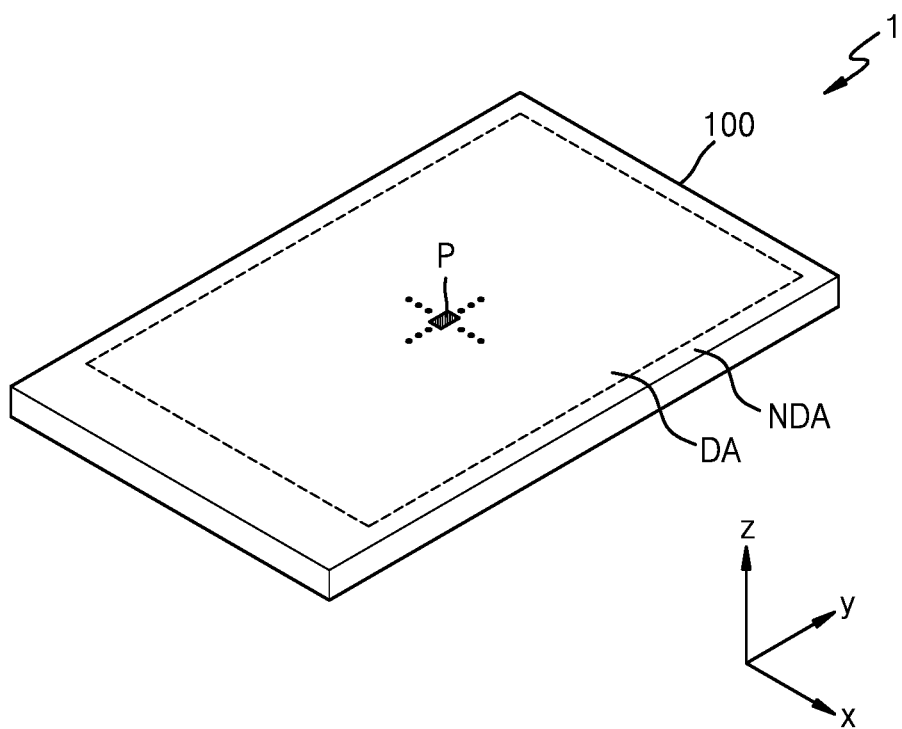
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The effects and features of the disclosure, and ways to achieve them will be become apparent by referring to embodiments that will be described later in detail with reference to the drawings. However, the disclosure is not limited to the following embodiments but may be embodied in various forms.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be further understood that terms such as "comprises," "comprising," "has,", "have", "having," "includes," and "including" as used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. For example, intervening layers, regions, or components may be present.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to," another layer, region, or component, it may be directly or indirectly connected to the other layer, region, or component. For example, intervening layers, regions, or components may be present. For example, it will be understood that when a layer, region, or component is referred to as being "electrically connected to," another layer, region, or component, it may be directly or indirectly electrically connected to the other layer, region, or component. For example, intervening layers, regions, or components may be present.

The term "overlap" may include layer, stack, face or facing, extending over, extending under, covering or partly covering or any other suitable term as would be appreciated and understood by those of ordinary skill in the art. The phrase "not overlap" may include "apart from" or "set aside from" or "offset from" and any other suitable equivalents as would be appreciated and understood by those of ordinary skill in the art.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

A display device, which may be a device for displaying an image, may be a mobile device, such as a game console, a multimedia device, or a tiny personal computer (PC). Examples of a display device that will be described below may include a liquid crystal display (LCD) device, an electrophoretic display device, an organic light-emitting display device, an inorganic light-emitting display device, a field emission display device, a surface-conduction electron-emitter display device, a quantum dot display device, a plasma display device, and a cathode ray display device. Hereinafter, an organic light-emitting display device will be described as an example of a display device according to an embodiment. However, a variety of types of display devices such as those described above may be used in one or more embodiments of the disclosure.

FIG. 1 is a perspective view schematically illustrating a display device 1 according to an embodiment.

Referring to FIG. 1, the display device 1 may include a display panel 100, a display area DA, and a non-display area NDA, wherein the display area DA and the non-display area NDA may be provided on the display panel 100.

An image may be realized in the display area DA. Pixels P may be disposed in the display area DA. An image may be provided from the display area DA by using pieces of light emitted from the pixels P.

The non-display area NDA may be an area in which no image may be provided. For example, no pixels P may be disposed in the non-display area NDA. The non-display area NDA may entirely surround the display area DA. A driver for providing electrical signals or power to the pixels P may be disposed in the non-display area NDA. A pad part (not shown), which may be an area to which an electronic device or a printed circuit board may be electrically connected, may be provided in the non-display area NDA.

Figure 2:
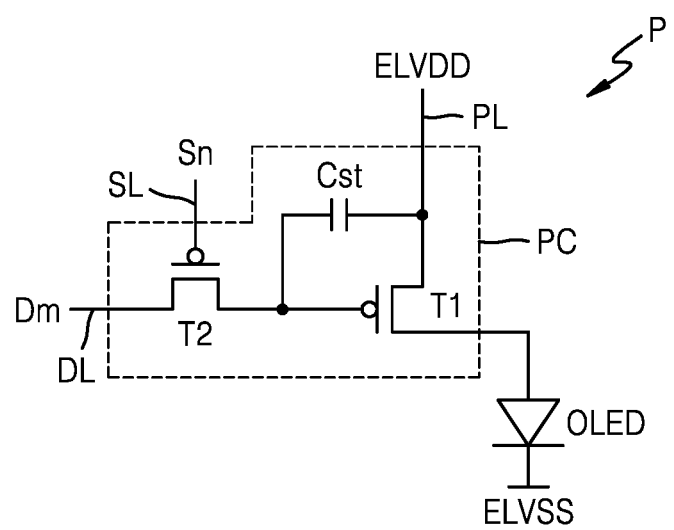
FIG. 2 is a schematic equivalent circuit diagram of a pixel included in a display device according to an embodiment.

FIG. 2 is a schematic equivalent circuit diagram of a pixel P included in a display device according to an embodiment.

Referring to FIG. 2, the pixel P may include a pixel circuit PC, a display element electrically connected to the pixel circuit PC, for example, an organic light-emitting diode OLED. The pixel circuit PC may include a first thin-film transistor T1, a second thin-film transistor T2, and a storage capacitor Cst. Each pixel P may emit red, green, or blue light, for example, or red, green, blue, or white light from the organic light-emitting diode OLED.

The second thin-film transistor T2 may be a switching thin-film transistor and may be electrically connected to a scan line SL and a data line DL. The second thin-film transistor T2 may transmit a data voltage or data signal Dm input from the data line DL to the first thin-film transistor T1 according to a switching voltage or switching signal Sn that may be input from the scan line SL. The storage capacitor Cst may be electrically connected to the second thin-film transistor T2 and a driving voltage line PL and may store a voltage corresponding to a difference between the voltage received from the second thin-film transistor T2 and a first power supply voltage ELVDD supplied to the driving voltage line PL.

The first thin-film transistor T1 may be a driving thin-film transistor and may be electrically connected to the driving voltage line PL and the storage capacitor Cst. The first thin-film transistor T1 may control a driving current flowing through the organic light-emitting diode OLED from the driving voltage line PL in correspondence with a value of the voltage stored in the storage capacitor Cst. The organic light-emitting diode OLED may emit light having a certain brightness according to the driving current. An opposite electrode (for example, a cathode) of the organic light-emitting diode OLED may receive a second power supply voltage ELVSS.

FIG. 2 illustrates that the pixel circuit PC may include two thin-film transistors and one storage capacitor. However, in another embodiment, the number of thin-film transistors and the number of storage capacitors may be variously changed according to the design of the pixel circuit PC.

Figure 3:
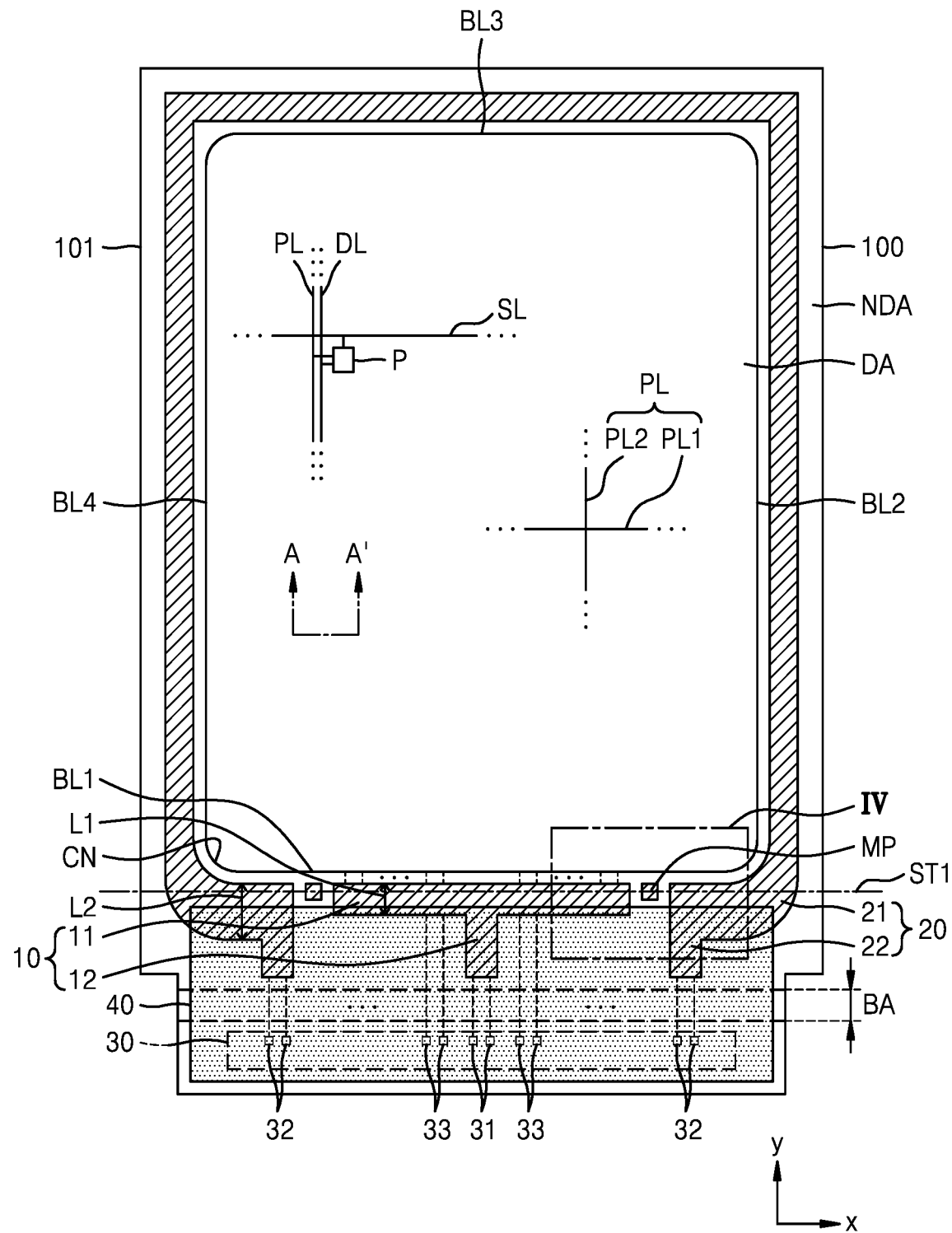
FIG. 3 is a plan view schematically illustrating a display panel and a cover film of a display device according to an embodiment.

FIG. 3 is a plan view schematically illustrating a display panel 100 and a cover film 40 of a display device according to an embodiment.

Referring to FIG. 3, the display device may include the display panel 100 and the cover film 40. The display panel 100 may include a display area DA and a non-display area NDA on a substrate 101. Here, the substrate 101 may be understood to include the display area DA and the non-display area NDA. Pixels P may be disposed in the display area DA, and a first voltage line 10, a second voltage line 20, and a terminal part 30 may be disposed in the non-display area NDA.

The substrate 101 may include one or more of glass or polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, or a combination thereof.

In an embodiment, the display area DA may have a polygonal shape. In another embodiment, the display area DA may have a polygonal shape including a curvature, as discussed more herein. For example, the display panel 100 may include a first boundary line BL1, a second boundary line BL2, a third boundary line BL3, and a fourth boundary line BL4, each defining a boundary between the display area DA and the non-display area NDA. The first boundary line BL1 and the third boundary line BL3 may extend in a first direction (for example, an x-direction), and the second boundary line BL2 and the fourth boundary line BL4 may extend in a second direction (for example, a y-direction) crossing the first direction. The first boundary line BL1 and the third boundary line BL3 may face each other with the display area DA therebetween, and the second boundary line BL2 and the fourth boundary line BL4 may face each other with the display area DA therebetween. A corner part CN connecting adjacent boundary lines may include the curvature. In another embodiment, the display area DA may have a circular or oval shape. In this way, the display area DA may have various shapes. Hereinafter, for convenience of explanation, the display area DA having the curvature at the corner part CN will be described in detail.

Pixels P may be electrically connected to the scan line SL which may extend in the first direction (for example, the x-direction) and the data line DL which may extend in the second direction (for example, the y-direction) crossing the first direction. Also, the pixels P may be electrically connected to the driving voltage line PL.

In an embodiment, the driving voltage line PL may include a first driving voltage line PL1 and a second driving voltage line PL2. The first driving voltage line PL1 may extend in the first direction (for example, the x-direction), and the second driving voltage line PL2 may extend in the second direction (for example, the y-direction) crossing the first direction. In an embodiment, the first driving voltage line PL1 and the second driving voltage line PL2 may be disposed on different layers. The first driving voltage line PL1 may be electrically connected to the second driving voltage line PL2 via a contact hole of an insulating layer between the first driving voltage line PL1 and the second driving voltage line PL2. Thus, the driving voltage line PL may be provided in a mesh structure. The pixels P may be electrically connected to the first driving voltage line PL1 or the second driving voltage line PL2. For example, the first power supply voltage (see ELVDD of FIG. 2) may be supplied to the pixels P via the first driving voltage line PL1 extending in the first direction or the second driving voltage line PL2 extending in the second direction.

The non-display area NDA may include a bending area BA. The bending area BA may be between the terminal part 30 and the display area DA. The substrate 101 may be bent in the bending area BA such that at least part of the terminal part 30 may overlap the display area DA and/or the non-display area. The terminal part 30 may not shield the display area DA and/or the non-display area, and a bending direction may be set so that the terminal part 30 may be placed behind the display area DA and/or the non-display area. Thus, the user may recognize that the display area DA occupies most of the display device relative to the non-display area.

At least part of the first voltage line 10 may overlap a first virtual straight line ST1 parallel with one side of the display area DA. One side of the display area DA may be defined as one of the first through fourth boundary lines BL1 to BL4. In case that one side of the display area DA may be the first boundary line BL1, the first straight line ST1 may be apart from the display area DA and thus may be arranged in the first direction (for example, the x-direction). In case that one side of the display area DA may be the second boundary line BL2, the first straight line ST1 may be apart from the display area DA and thus may be disposed in the second direction (for example, the y-direction). Hereinafter, the case where one side of the display area DA may be the first boundary line BL1, will be described.

The first voltage line 10 may include a first main voltage line 11 and a first connection line 12, which may be disposed at one side of the display area DA. The first main voltage line 11 may overlap the first straight line ST1, and the first connection line 12 may extend in a direction (for example, the y-direction or –y-direction) crossing the first straight line ST1 and thus may be electrically connected to a first terminal 31 of the terminal part 30.

The first main voltage line 11 may extend in the first direction (for example, the x-direction). In an embodiment, a length at which the first main voltage line 11 may extend may be less than a length of one side of the display area DA. For example, the first main voltage line 11 may not surround one or more of the corner parts CN but may correspond to the first straight line ST1. Because the driving voltage line PL that may be electrically connected to the first main voltage line 11 may have a mesh structure including the first driving voltage line PL1 and the second driving voltage line PL2 that may cross the first driving voltage line PL1, the first power supply voltage ELVDD may be transmitted to the pixels P disposed in the display area DA even in case that the first voltage line 10 may not surround one or more of the corner parts CN and may not extend in the second direction (for example, the y-direction).

The second voltage line 20 may surround at least part of the display area DA. In an embodiment, the second voltage line 20 may extend along the other sides excluding a side of the display area DA adjacent to the first voltage line 10. For example, the second voltage line 20 may extend to correspond to the second boundary line BL2, the third boundary line BL3, and the fourth boundary line BL4. In another embodiment, the second voltage line 20 may correspond to the second boundary line BL2 and the fourth boundary line BL4.

The second voltage line 20 may surround the corner parts CN. In case that a corner part CN includes a curvature, the second voltage line 20 may also include a curvature. In another example, even in case that a corner part CN includes a curvature, the second voltage line 20 may have a bent shape.

The second voltage line 20 may include a second main voltage line 21 that may surround at least part of the display area DA, and a second connection line 22 disposed in parallel with the first connection line 12 in the second direction (for example, the y-direction). The second connection line 22 may be electrically connected to a second terminal 32 of the terminal part 30.

In an embodiment, a width L1 of the first voltage line 10 may be less than a width L2 of the second voltage line 20. Each of the width L1 of the first voltage line 10 and the width L2 of the second voltage line 20 may be defined in a direction perpendicular to a direction in which the first voltage line 10 and the second voltage line 20 may extend. For example, the width L1 of the first voltage line 10 may be defined as a length of the first voltage line 10 in a direction (for example, the y-direction) perpendicular to the first direction. The width L2 of the second voltage line 20 may be defined as a length of the second voltage line 20 of a portion corresponding to the first boundary line BL1 in a direction (for example, the y-direction) perpendicular to the first direction. In an embodiment, the width L2 of the second voltage line 20 may be greater than the width L1 of the first voltage line 10 so that the amount of heat generated by the second voltage line 20 may be reduced.

In order to realize a brighter screen so that visibility may be enhanced even in an outdoor environment having a high external light amount, the amount of a current flowing through the display element may need to be increased. Thus, the amount of a current flowing through the first voltage line 10 and the second voltage line 20 may need to be increased. Unlike in an embodiment, in case that both of the first voltage line 10 and the second voltage line 20 extend to and correspond to the corner parts CN and a high current flows through the first voltage line 10 and the second voltage line 20, the amount of heat generated by the portion corresponding to the corner part CN of the non-display area NDA may be relatively high (increased) compared to the amount of heat generated by a portion corresponding to other boundary lines. The organic light-emitting diode (see OLED of FIG. 2) may be deteriorated inside portions of the display area DA corresponding to the corner parts CN. In an embodiment, the first voltage line 10 may correspond to the first boundary line BL1, and the first driving voltage line PL1 and the second driving voltage line PL2, which may be electrically connected to the first voltage line 10, may be provided in a mesh structure. Also, the second voltage line 20 may be disposed at the corner parts CN, and the width L2 of the second voltage line 20 may be greater than the width L1 of the first voltage line 10 so that the amount of heat generated by the corner parts CN may be reduced. Thus, in one or more embodiments of the disclosure, the amount of the current flowing through the first voltage line 10 and the second voltage line 20 may be increased even in an outdoor environment having a high external light amount so that visibility may be enhanced. Deterioration of the organic light-emitting diodes OLEDs disposed in portions of the display area DA corresponding to the corner parts CN may be prevented.

The terminal part 30 may be disposed at one end of the substrate 101 and may include terminals, that is, first, second, and third terminals 31, 32, and 33. The terminal part 30 may not be covered by the insulating layer but may be exposed and thus may be electrically connected to a controller (not shown), such as a flexible printed circuit board, a driving driver integrated circuit (IC) chip, or the like.

The controller may change image signals transmitted from the outside into image data signals and may transmit the image data signals to the display area DA through the third terminal 33. Also, the controller may receive a vertical synchronous signal, a horizontal synchronous signal, and a clock signal so as to generate a control signal for controlling driving of each of first and second gate driving circuits (not shown) and to transmit the control signal to each the first and second gate driving circuits (not shown) through a terminal (not shown).

The controller may transmit different voltages to the first voltage line 10 and the second voltage line 20 through the first terminal 31 and the second terminal 32, respectively.

The first voltage line 10 may provide the first power supply voltage (see ELVDD of FIG. 2) to each of the pixels P, and the second voltage line 20 may provide the second power supply voltage (see ELVSS of FIG. 2) to each pixel P. For example, the first power supply voltage ELVDD may be provided to each pixel P through the driving voltage line PL electrically connected to the first voltage line 10. The second power supply voltage ELVSS may be electrically connected to a cathode of the organic light-emitting diode (see OLED of FIG. 2) provided in each pixel P in the non-display area NDA.

Although not shown, a scan driver for providing a scan signal to the scan line SL of each pixel P, a data driver for providing a data signal to the data line DL, and a dam portion adjacent to or surrounding the display area DA may be disposed in the non-display area NDA.

In an embodiment, a metallic pattern MP may be between the first voltage line 10 and the second voltage line 20. The metallic pattern MP may be disposed along an extension line of the first voltage line 10. For example, the metallic pattern MP may be disposed along the first straight line ST1. Also, in an embodiment, the metallic pattern MP may be between the display area DA and the cover film 40. The metallic pattern MP may be between the first voltage line 10 and the second voltage line 20 in the first direction (for example, the x-direction) and between the display area DA and the cover film 40 in the second direction (for example, the y-direction). A detailed description of the metallic pattern MP will be provided below with reference to FIG. 4.

The cover film 40 may be disposed in the non-display area NDA. The cover film 40 may be apart from the display area DA in the second direction (for example, the y-direction). The cover film 40 may be disposed on the first voltage line 10 and the second voltage line 20. In other words, the first voltage line 10 and the second voltage line 20 may be between the substrate 101 and the cover film 40. Thus, the cover film 40 may cover part of the first voltage line 10 or part of the second voltage line 20.

The cover film 40 may overlap the first voltage line 10 or the second voltage line 20. For example, the cover film 40 may overlap part of the first main voltage line 11 and may overlap the first connection line 12. Also, the cover film 40 may overlap part of the second main voltage line 21 and may overlap the second connection line 22.

The cover film 40 may employ various configurations that may shield light. In some embodiments, the cover film 40 may be a film covered with a material for absorbing light or preventing light transmission. The cover film 40 may include a flexible film.

Figure 4:
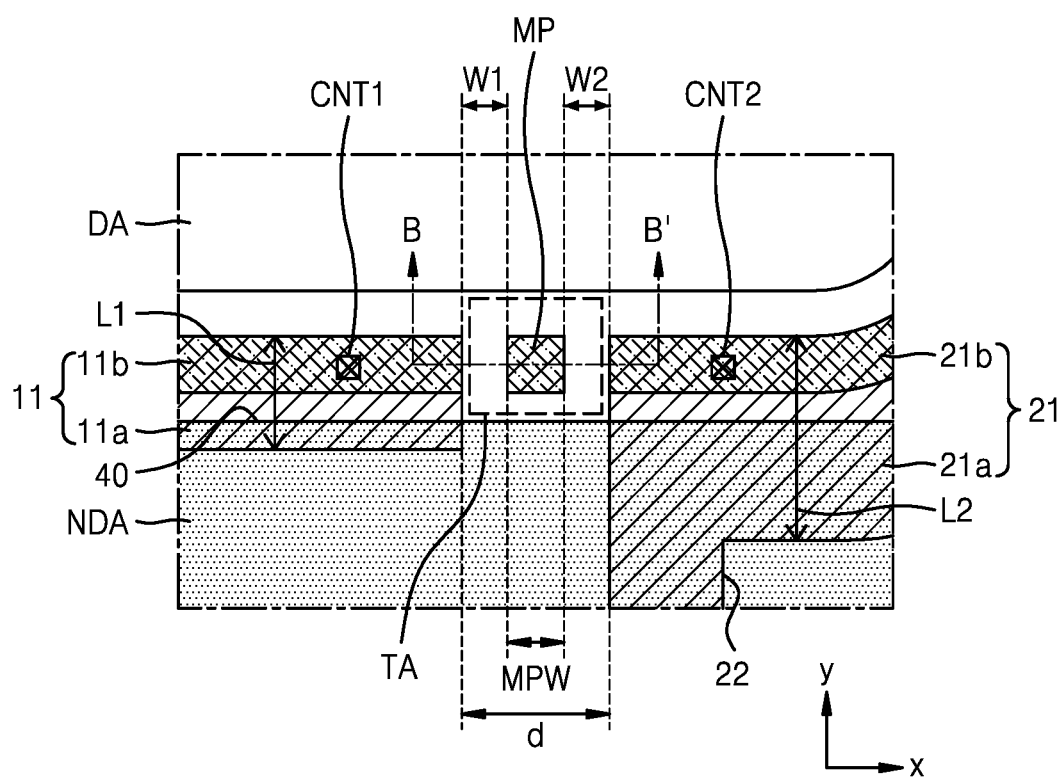
FIG. 4 is an enlarged schematic view of region IV of FIG. 3.

FIG. 4 is an enlarged schematic view of region IV of FIG. 3. In FIG. 4, like reference numerals in FIG. 3 represent like elements. Thus, a redundant description therewith will be omitted.

Referring to FIG. 4, the display device may include the display area DA and the non-display area NDA that may surround the display area DA. A first voltage line may be disposed in the non-display area NDA and may supply a first power supply voltage to pixels disposed in the display area DA. The first voltage line may include the first main voltage line 11 and a first connection line 12. A second voltage line may be apart from the first voltage line in the non-display area NDA and may supply a second power supply voltage to the pixels disposed in the display area DA. The second voltage line may include a second main voltage line 21 and a second connection line 22. The metallic pattern MP may be between the first voltage line and the second voltage line. The cover film 40 may be disposed in the non-display area NDA.

In an embodiment, the first voltage line may include a first lower voltage line and a first upper voltage line on the first lower voltage line. For example, as shown in FIG. 4, the first main voltage line 11 may include a first lower main voltage line 11a and a first upper main voltage line 11b on the first lower main voltage line 11a. The width of the first lower main voltage line 11a may be greater than a width of the first upper main voltage line 11b. Also, the first lower main voltage line 11a and the first upper main voltage line 11b may be electrically connected to each other via a first contact hole CNT1 of an insulating layer between the first lower main voltage line 11a and the first upper main voltage line 11b.

In an embodiment, the second voltage line may include a second lower voltage line and a second upper voltage line on the second lower voltage line. For example, as shown in FIG. 4, the second main voltage line 21 may include a second lower main voltage line 21a, and a second upper main voltage line 21b on the second lower main voltage line 21a. The width of the second lower main voltage line 21a may be greater than a width of the second upper main voltage line 21b. Also, the second lower main voltage line 21a and the second upper main voltage line 21b may be electrically connected to each other via a second contact hole CNT2 of an insulating layer between the second lower main voltage line 21a and the second upper main voltage line 21b.

In the embodiment, a width L1 of the first voltage line may be less than a width L2 of the second voltage line. The width L1 of the first voltage line may be defined as a width of the first lower main voltage line 11a. The width L2 of the second voltage line may be defined as a width of the second lower main voltage line 21a.

In an embodiment, a shortest distance d between the first voltage line and the second voltage line may be greater than a width MPW of the metallic pattern MP. The shortest distance d between the first voltage line and the second voltage line may be defined as a minimum of a separation distance between adjacent first and second voltage lines. For example, referring to FIG. 4, the shortest distance d between the first voltage line and the second voltage line may be a separation distance between the first main voltage line 11 and the second main voltage line 21 in the first direction (for example, the x-direction). Because the width MPW of the metallic pattern MP may be less than the separation distance between the first main voltage line 11 and the second main voltage line 21, the metallic pattern MP may be between the first main voltage line 11 and the second main voltage line 21.

In an embodiment, the first voltage line and the metallic pattern MP may be apart from each other. For example, the first main voltage line 11 and the metallic pattern MP may be apart from each other in the first direction (for example, the x-direction). A distance W1 between the first main voltage line 11 and the metallic pattern MP may be equal to or less than about 50 µm. In detail, the distance W1 between the first main voltage line 11 and the metallic pattern MP may be about 1 µm to about 50 µm. In case that the distance W1 between the metallic pattern MP and the first voltage line is equal to or less than about 1 µm, the metallic pattern MP and the first voltage line may be extended to each other due to a process error when the metallic pattern MP and the first voltage line are formed.

In an embodiment, the second voltage line and the metallic pattern MP may be apart from each other. For example, the second main voltage line 21 and the metallic pattern MP may be apart from each other in the first direction (for example, the x-direction). The distance W2 between the second main voltage line 21 and the metallic pattern MP may be equal to or less than about 50 μm. In detail, the distance W2 between the metallic pattern MP and the second voltage line may be about 1 μm to about 50 μm. When the distance W2 between the metallic pattern MP and the second voltage line is equal to or less than about 1 μm, the metallic pattern MP and the second voltage line may be extended to each other due to the process error when the metallic pattern MP and the second voltage line are formed.

In an embodiment, the metallic pattern MP may be between the first voltage line and the second voltage line so that sparkles that may be caused by external light reflection in the non-display area NDA may be minimized owing to a distance between the first voltage line and the second voltage line. Unlike in an embodiment where a metallic pattern MP may be between the first voltage line and the second voltage line, a distance between the first voltage line and the second voltage line may be about 50 μm. Also, a transmission area TA, through which external light may transmit, may be formed between the display area DA and the cover film 40 due to the process error in a process of attaching the cover film 40 onto the non-display area NDA.

Thus, the user may recognize external light or external light reflection through the transmission area TA defined between the first voltage line and the second voltage line and between the display area DA and the cover film 40. For example, the user may sense sparkles in the transmission area TA adjacent to the display area DA caused by external light or external light reflection. In particular, the user may recognize external light or external light reflection in case that all of the width of the transmission area TA in the first direction (for example, the x-direction) and the width of the transmission area TA in the second direction (for example, the y-direction) exceed about 50 μm. In an embodiment, the metallic pattern MP may be between the first voltage line and the second voltage line so that sparkles that may be caused by external light or external light reflection in the transmission area TA may be minimized. In particular, in case that the distance W1 between the first voltage line and the metallic pattern MP and/or the distance W2 between the second voltage line and the metallic pattern MP is/are equal to or less than about 50 μm, the user may not recognize external light or external light reflection. Thus, sparkles caused by external light or external light reflection in the non-display area NDA may be minimized.

Hereinafter, a stack structure of the display device will be described in detail with reference to FIGS. 5 through 7.

Figure 5:
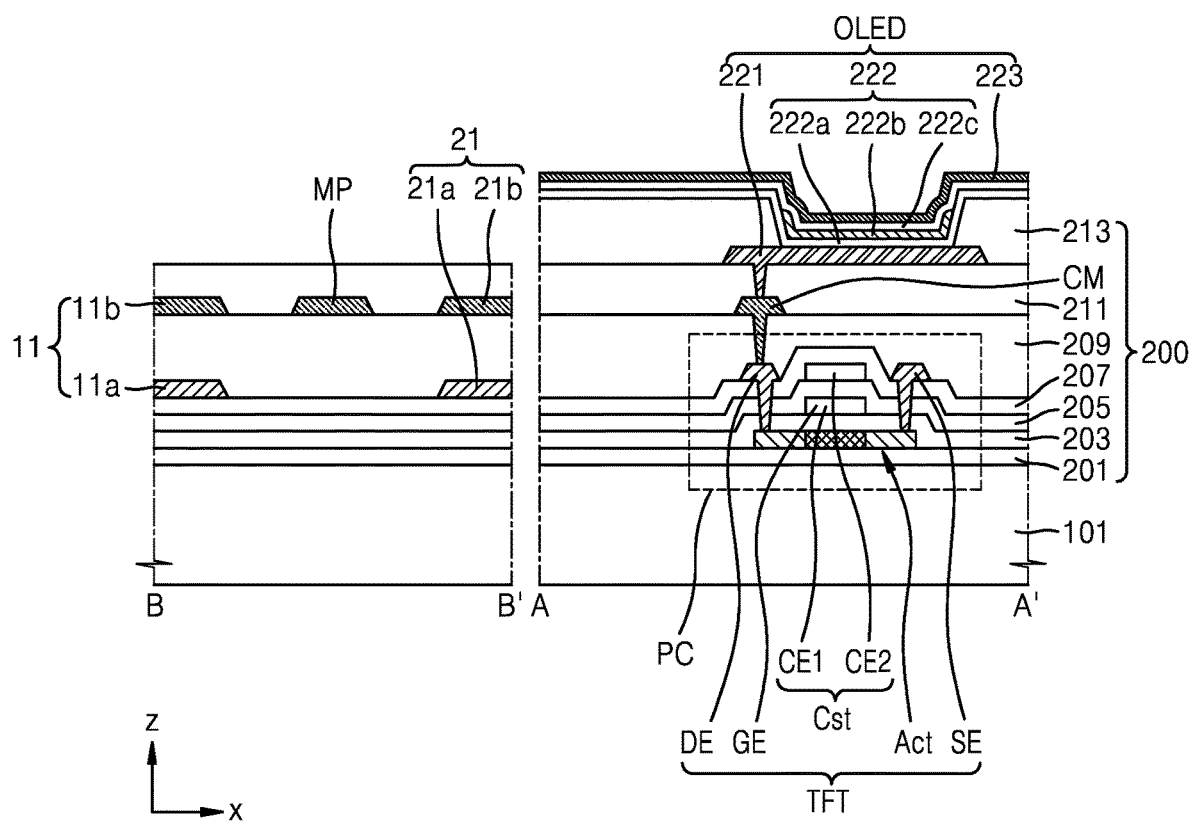
FIGS. 5 through 7 are schematic cross-sectional views taken along line A-A' of FIG. 3 and line B-B' of FIG. 4 of a display device according to an embodiment.
Figure 6:
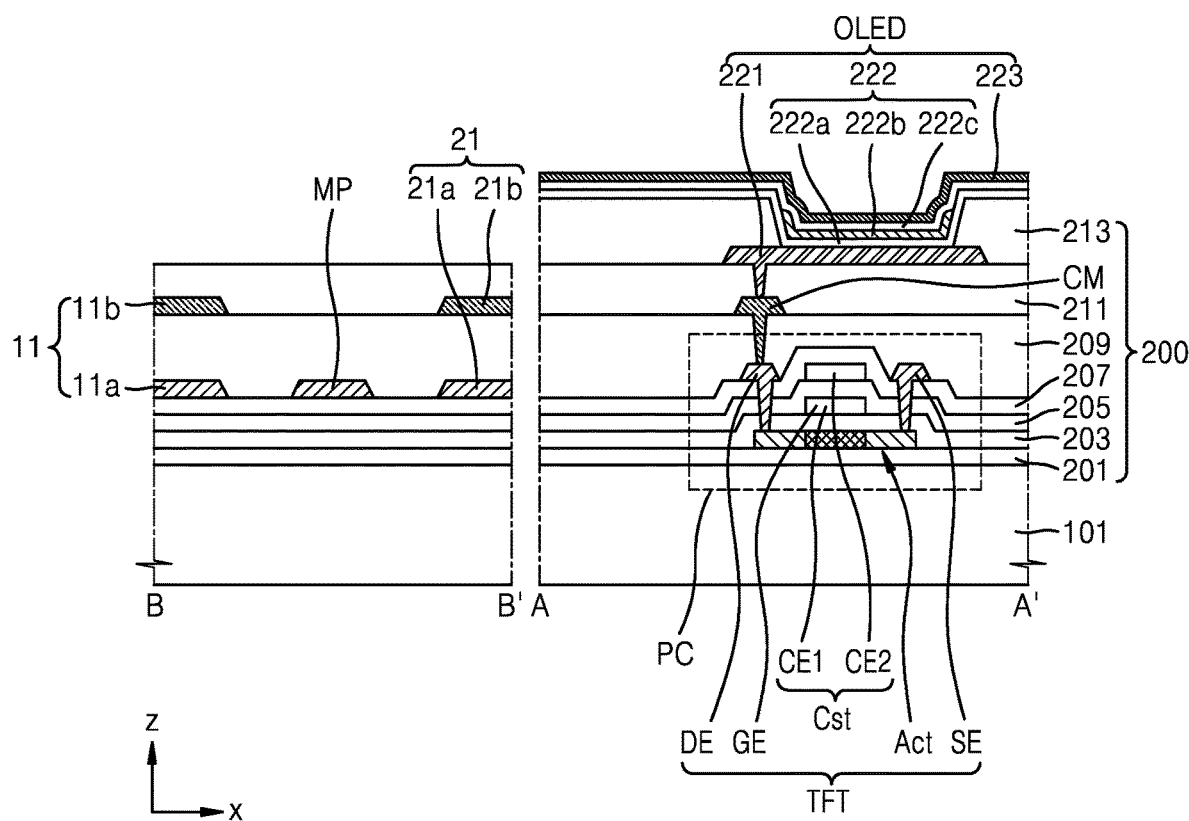
Figure 7:
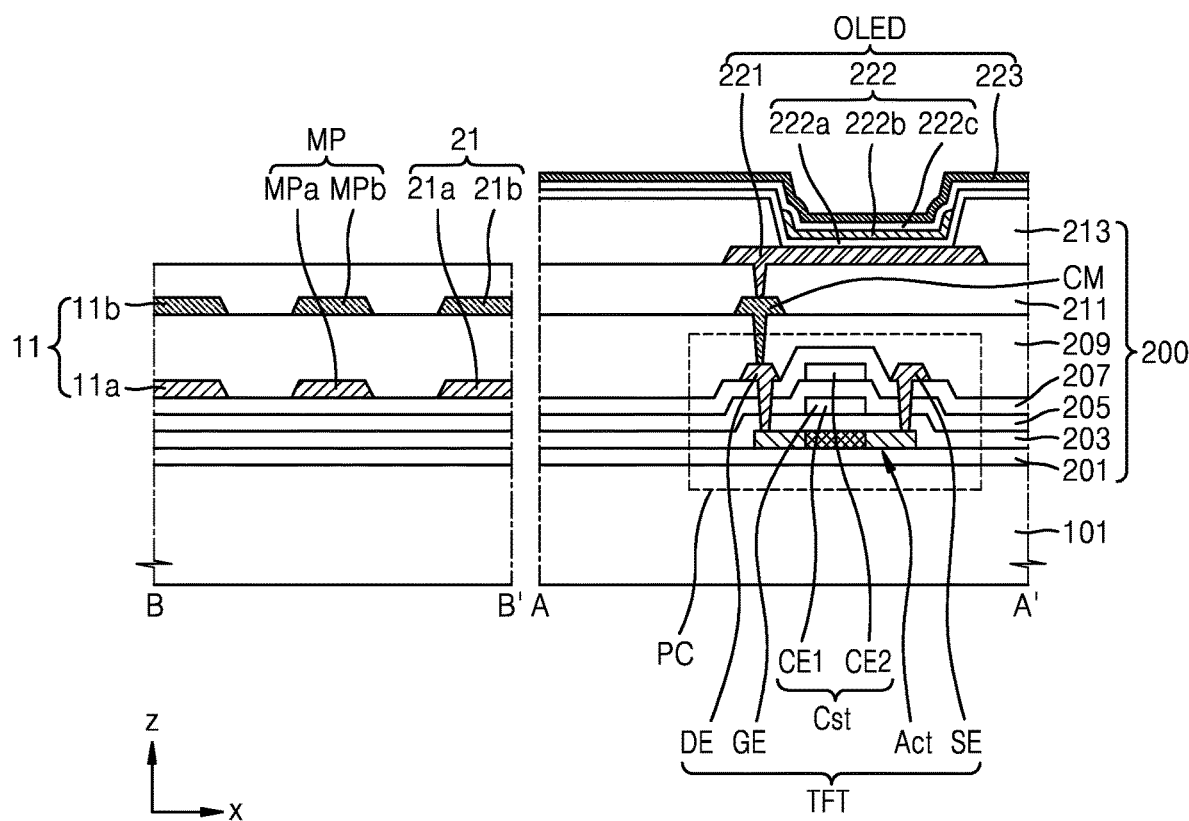

FIGS. 5 through 7 are schematic cross-sectional views taken along line A-A' of FIG. 3 and line B-B' of FIG. 4 of a display device according to an embodiment. In FIGS. 5 through 7, like reference numerals in FIGS. 3 and 4 represent like elements and thus, a redundant description thereof will be omitted.

Referring to FIGS. 5 through 7, a pixel circuit PC, and an organic light-emitting diode OLED as a display element that may be electrically connected to the pixel circuit PC may be disposed on the substrate 101. The pixel circuit PC may include a thin-film transistor TFT and a storage capacitor Cst, as described above with reference to FIG.

A buffer layer 201 may be between the substrate 101 and the pixel circuit PC and may prevent an impurity from penetrating into the thin-film transistor TFT. The buffer layer 201 may include inorganic insulating materials, such as silicon nitride, silicon oxynitride, silicon oxide, or a combination thereof, and may have a single layer or multi-layer structure including the inorganic insulating materials described above.

The thin-film transistor TFT may include a semiconductor layer Act, a gate electrode GE, a source electrode SE, and a drain electrode DE. FIGS. 5 through 7 illustrate a top gate-type in which the gate electrode GE may be disposed on the semiconductor layer Act with a gate insulating layer 203 therebetween. However, according to another embodiment, the thin-film transistor TFT may be of a bottom gate-type.

The semiconductor layer Act may include polysilicon. As another example, the semiconductor layer Act may include amorphous silicon, an oxide semiconductor, an organic semiconductor, or a combination thereof. The gate electrode GE may include a low-resistance metallic material. The gate electrode GE may include conductive materials including molybdenum (Mo), aluminum (Al), copper (Cu), titanium (Ti), or a combination thereof, and may have a multi-layer or single layer structure including the materials described above.

The gate insulating layer 203 that may be between the semiconductor layer Act and the gate electrode GE may include inorganic insulating materials, such as silicon oxide, silicon nitride, silicon oxynitride, aluminum oxide, titanium oxide, tantalum oxide, hafnium oxide, or a combination thereof. The gate insulating layer 203 may have a single layer or multi-layer structure including the materials described above.

The source electrode SE and the drain electrode DE may be disposed on a same layer, for example, on a second interlayer insulating layer 207, and may include a same material. The source electrode SE and the drain electrode DE may include materials having good conductivity. The source electrode SE and the drain electrode DE may include conductive materials including Mo, Al, Cu, Ti, or a combination thereof, and may have a multi-layer or single layer structure including the materials described above. In an embodiment, the source electrode SE and the drain electrode DE may have a multi-layer structure of a Ti layer, an Al layer, and a Ti layer (Ti/Al/Ti).

The storage capacitor Cst may include a lower electrode CE1 and an upper electrode CE2 that may overlap each other with the first interlayer insulating layer 205 therebetween. The storage capacitor Cst may overlap the thin-film transistor TFT. In this regard, FIGS. 5 through 7 illustrate that the gate electrode GE of the thin-film transistor TFT is the lower electrode CE1 of the storage capacitor Cst. In another embodiment, the storage capacitor Cst may not overlap the thin-film transistor TFT. The storage capacitor Cst may be covered by the second interlayer insulating layer 207. The upper electrode CE2 of the storage capacitor Cst may include conductive materials including Mo, Al, Cu, Ti, or a combination thereof, and may have a multi-layer or single layer structure including the materials described above.

The first interlayer insulating layer 205 and the second interlayer insulating layer 207 may include inorganic insulating materials such as silicon oxide, silicon nitride, silicon oxynitride, or a combination thereof. The first interlayer insulating layer 205 and the second interlayer insulating layer 207 may have a single layer or multi-layer structure including the materials described above.

The thin-film transistor TFT and the storage capacitor Cst may be covered by a first organic insulating layer 209.

A second organic insulating layer 211 may be disposed on the first organic insulating layer 209. The first organic insulating layer 209 and the second organic insulating layer 211 may include organic insulating materials. The organic insulating materials may include general-purpose polymer, such as polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof.

A pixel electrode 221 may be disposed on the second organic insulating layer 211. In some embodiments, an inorganic insulating layer (not shown) may be disposed on the second organic insulating layer 211, and a pixel electrode 221 may be disposed on the inorganic insulating layer.

The pixel electrode 221 may be electrically connected to the thin-film transistor TFT of the pixel circuit PC. In this regard, FIGS. 5 through 7 illustrate that the thin-film transistor TFT and the pixel electrode 221 may be electrically connected to each other via a contact conductive pattern CM on the first organic insulating layer 209. The contact conductive pattern CM may include conductive materials including Mo, Al, Cu, Ti, or a combination thereof, and may have a multi-layer or single layer structure including the materials described above. In an embodiment, the contact conductive pattern CM may have a multi-layer structure of a Ti layer, an Al layer, and a Ti layer (Ti/Al/Ti).

The pixel electrode 221 may include transparent conductive oxide, such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. In another embodiment, the pixel electrode 221 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof. In another embodiment, the pixel electrode 221 may further include a layer formed of ITO, IZO, ZnO, or $In_2O_3$ on/under the reflective layer described above. For example, the pixel electrode 221 may have a three-layer structure in which an ITO layer, an µg layer and an ITO layer may be stacked on each other.

A pixel-defining layer 213 may cover edges of the pixel electrode 221 and may include an opening that overlaps the center part of the pixel electrode 221. The opening of the pixel electrode 221 may define a light-emitting area.

The pixel-defining layer 213 may include an organic insulating material, such as polyimide. As another example, the pixel-defining layer 213 may include an inorganic insulating material. As another example, the pixel-defining layer 213 may include an organic insulating material and an inorganic insulating material.

The intermediate layer 222 may be disposed on the pixel-defining layer 213. The intermediate layer 222 may include a light-emitting layer 222b. The light-emitting layer 222b may include an organic light-emitting material, such as a polymer or small molecular weight organic material that emits light of a certain color. As another example, the light-emitting layer 222b may include an inorganic light-emitting material or quantum dots.

A first functional layer 222a and a second functional layer 222c may be disposed under and on the light-emitting layer 222b.

The first functional layer 222a may have a single layer or multi-layer structure. For example, the first functional layer 222a may be a hole transport layer (HTL) having a single layer structure and may be formed of poly-(3,4)-ethylene-dihydroxy thiophene (PEDOT) or polyaniline (PANI). As another example, the first functional layer 222a may include a hole injection layer (HIL) and an HTL.

The second functional layer 222c may have a single layer or multi-layer structure. The second functional layer 222c may include an electron transport layer (ETL) and/or an electron injection layer (EIL).

FIGS. 5 through 7 illustrate that the intermediate layer 222 may include the first functional layer 222a and the second functional layer 222c. However, in another embodiment, the intermediate layer 222 may optionally include the first functional layer 222a and the second functional layer 222c. For example, the intermediate layer 222 may not include the second functional layer 222c.

The light-emitting layer 222b of the intermediate layer 222 may be disposed in each pixel, whereas the first functional layer 222a and the second functional layer 222c may be formed as a single body so as to cover the pixels.

An opposite electrode 223 may include a conductive material having a small work function. For example, the opposite electrode 223 may include a (semi-)transparent layer including Ag, Mg, Al, Pt, Pd, Au, Ni, Nd, Ir, Cr, lithium (Li), calcium (Ca), or an alloy thereof. As another example, the opposite electrode 223 may further include a layer such as ITO, IZO, ZnO, or $In_2O_3$, on the (semi-)transparent layer including the materials described above. The opposite electrode 223 may be formed as a single body so as to cover the pixels. For example, the opposite electrode 223 may entirely cover the substrate 101. The area of the opposite electrode 223 may be different from the area of the first functional layer 222a and the area of the second functional layer 222c described above.

An upper portion of the opposite electrode 223 may be covered by an encapsulation layer (not shown). The encapsulation layer may include at least one inorganic encapsulation layer and/or at least one organic encapsulation layer. In an embodiment, the encapsulation layer may include a first inorganic encapsulation layer, an organic encapsulation layer, and a second inorganic encapsulation layer.

Each of the first inorganic encapsulation layer and the second inorganic encapsulation layer may include one or more inorganic insulating materials. The inorganic insulating materials may include aluminum oxide, tantalum oxide, hafnium oxide, zinc oxide, silicon oxide, silicon nitride or/and silicon oxynitride. The organic encapsulation layer may include polymer-based materials. The polymer-based materials may include acryl-based resin, epoxy-based resin, polyimide, polyethylene, or a combination thereof. The acryl-based resin may include polymethylmethacrylate, polyacrylic acid, and the like, or a combination thereof.

In another embodiment, the encapsulation layer may have a structure in which the substrate 101 and an upper substrate as a transparent member are combined with each other by using a sealing member and thus an internal space between the substrate 101 and the upper substrate may be sealed. A moisture absorbent or filling material may be disposed in the internal space. The sealing member may be a sealant. In another embodiment, the sealing member may include a material cured by laser. For example, the sealing member may include frit. In detail, the sealing member may include urethane-based resin, epoxy-based resin, acryl-based resin that are organic sealants, silicon as an inorganic sealant, or a combination thereof. The urethane-based resin may include, for example, urethane acrylate, or the like. The acryl-based resin may include, for example, butyl acrylate, ethyl hexylacrylate, or the like, or a combination thereof. The sealing member may include a material cured by heat.

A touch electrode layer (not shown) including touch electrodes may be disposed on the encapsulation layer, and an optical functional layer (not shown) may be disposed on the touch electrode layer. The touch electrode layer may attain coordinate information according to an external input, for example, a touch event. The optical functional layer may reduce reflectivity of light (external light) incident toward the display device from the outside and/or may enhance color purity of light emitted from the display device. In an embodiment, the optical functional layer may include a phase retarder and a polarizer. The phase retarder may be of a film type or liquid crystal coating type and may include a λ/2 phase retarder and/or a λ/4 phase retarder. The polarizer may also be of a film type or liquid crystal coating type. The film type may include an elongation-type synthetic resin film, and the liquid crystal coating type may include liquid crystals positioned in a certain arrangement. The phase retarder and the polarizer may further include a protective film.

In another embodiment, the optical functional layer may include a black matrix and color filters. The color filters may be disposed considering a color of light to be emitted from each of the pixels. Each of the color filters may include a red, green, or blue pigment or dye. As another example, each of the color filters may further include quantum dots in addition to the pigment or dye described above. As another example, some of the color filters may not include the pigment or dye described above and may include scattering particles, such as titanium oxide.

In another embodiment, the optical functional layer may include a destructive offset structure. The destructive offset structure may include a first reflective layer and a second reflective layer, which may be disposed on different layers. First reflected light and second reflected light that may be reflected from each of the first reflective layer and the second reflective layer may destructively interfere. Thus, reflectivity of external light may be reduced.

The first lower main voltage line 11a and the second lower main voltage line 21a may be disposed on the second interlayer insulating layer 207. In detail, the first lower main voltage line 11a and the second lower main voltage line 21a may be between the second interlayer insulating layer 207 and the first organic insulating layer 209. The first lower main voltage line 11a and the second lower main voltage line 21a may include a same material as a material for forming the source electrode SE or the drain electrode DE. The first lower main voltage line 11a and the second lower main voltage line 21a may be simultaneously formed when the source electrode SE or the drain electrode DE may be formed.

The first upper main voltage line 11b and the second upper main voltage line 21b may be disposed on the first organic insulating layer 209. In detail, the first upper main voltage line 11b and the second upper main voltage line 21b may be between the first organic insulating layer 209 and the second organic insulating layer 211. The first upper main voltage line 11b and the second upper main voltage line 21b may include a same material as a material for forming the contact conductive pattern CM. The first upper main voltage line 11b and the second upper main voltage line 21b may be simultaneously formed when the contact conductive pattern CM may formed.

In an embodiment, referring to FIG. 5, the metallic pattern MP may be disposed on a same layer as the first upper main voltage line 11b or the second upper main voltage line 21b. The metallic pattern MP may include a same material as a material for forming the first upper main voltage line 11b or the second upper main voltage line 21b. The metallic pattern MP may be formed simultaneously when the first upper main voltage line 11b or the second upper main voltage line 21b may be formed. For example, after shielding between the first upper main voltage line 11b and the metallic pattern MP and between the second upper main voltage line 21b and the metallic pattern MP may be performed with a mask, the metallic pattern MP, the first upper main voltage line 11b, and the second upper main voltage line 21b may be formed.

The metallic pattern MP may be apart from the first upper main voltage line 11b or the second upper main voltage line 21b. A distance between the metallic pattern MP and the first upper main voltage line 11b or between the metallic pattern MP and the second upper main voltage line 21b may be about 1 μm to about 50 μm.

In an embodiment, referring to FIG. 6, the metallic pattern MP may be disposed on a same layer as the first lower main voltage line 11a or the second lower main voltage line 21a. The metallic pattern MP may include a same material as a material for forming the first lower main voltage line 11a or the second lower main voltage line 21a. The metallic pattern MP may be formed simultaneously when the first lower main voltage line 11a or the second lower main voltage line 21a may be formed. For example, after shielding between the first lower main voltage line 11a and the metallic pattern MP and between the second lower main voltage line 21a and the metallic pattern MP may be performed with the mask, the metallic pattern MP, the first lower main voltage line 11a, and the second lower main voltage line 21a may be formed.

The metallic pattern MP may be apart from the first lower main voltage line 11a or the second lower main voltage line 21a. A distance between the metallic pattern MP and the first lower main voltage line 11a or between the metallic pattern MP and the second lower main voltage line 21a may be about 1 μm to about 50 μm.

In an embodiment, referring to FIG. 7, the metallic pattern MP may include a lower metallic pattern MPa, and an upper metallic pattern MPb on the lower metallic pattern MPa. FIG. 7 illustrates that the lower metallic pattern MPa and the upper metallic pattern MPb may be apart from each other. However, in some embodiments, the lower metallic pattern MPa and the upper metallic pattern MPb may be connected to each other via a contact hole disposed in the first organic insulating layer 209.

The lower metallic pattern MPa may be disposed on a same layer as the first lower main voltage line 11a or the second lower main voltage line 21a. The lower metallic pattern MPa may include a same material as the material for forming the first lower main voltage line 11a or the second lower main voltage line 21a. The lower metallic pattern MPa may be formed simultaneously when the first lower main voltage line 11a or the second lower main voltage line 21a may be formed. For example, after shielding between the first lower main voltage line 11a and the lower metallic pattern MPa and between the second lower main voltage line 21a and the lower metallic pattern MPa may be performed with the mask, the lower metallic pattern MPa, the first lower main voltage line 11a, and the second lower main voltage line 21a may be formed.

The lower metallic pattern MPa may be apart from the first lower main voltage line 11a or the second lower main voltage line 21a. A distance between the lower metallic pattern MPa and the first lower main voltage line 11a or between the lower metallic pattern MPa and the second lower main voltage line 21a may be about 1 μm to about 50 μm.

The upper metallic pattern MPb may be disposed on a same layer as the first upper main voltage line 11b or the second upper main voltage line 21b. The upper metallic pattern MPb may include a same material as the material for forming the first upper main voltage line 11b or the second upper main voltage line 21b. The upper metallic pattern MPb may be formed simultaneously when the first upper main voltage line 11b or the second upper main voltage line 21b may be formed. For example, after shielding between the first upper main voltage line 11b and the upper metallic pattern MPb and between the second upper main voltage line 21b and the upper metallic pattern MPb may be performed with the mask, the upper metallic pattern MPb, the first upper main voltage line 11b, and the second upper main voltage line 21b may be formed.

The upper metallic pattern MPb may be apart from the first upper main voltage line 11b or the second upper main voltage line 21b. A distance between the upper metallic pattern MPb and the first upper main voltage line 11b or between the upper metallic pattern MPb and the second upper main voltage line 21b may be about 1 µm to about 50 µm.

Figure 8:
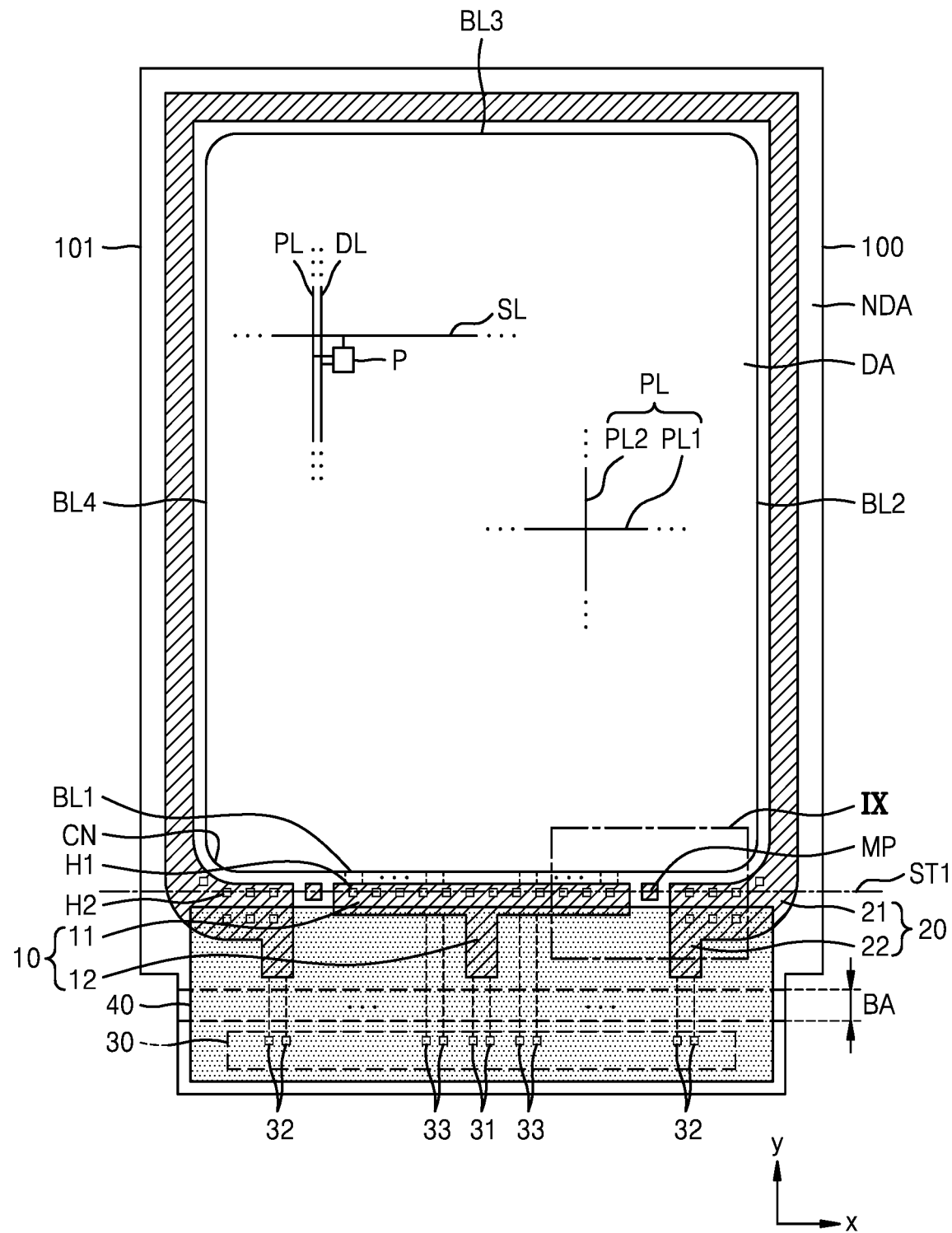
FIG. 8 is a plan view schematically illustrating a display panel and a cover film of a display device according to another embodiment.
Figure 9:
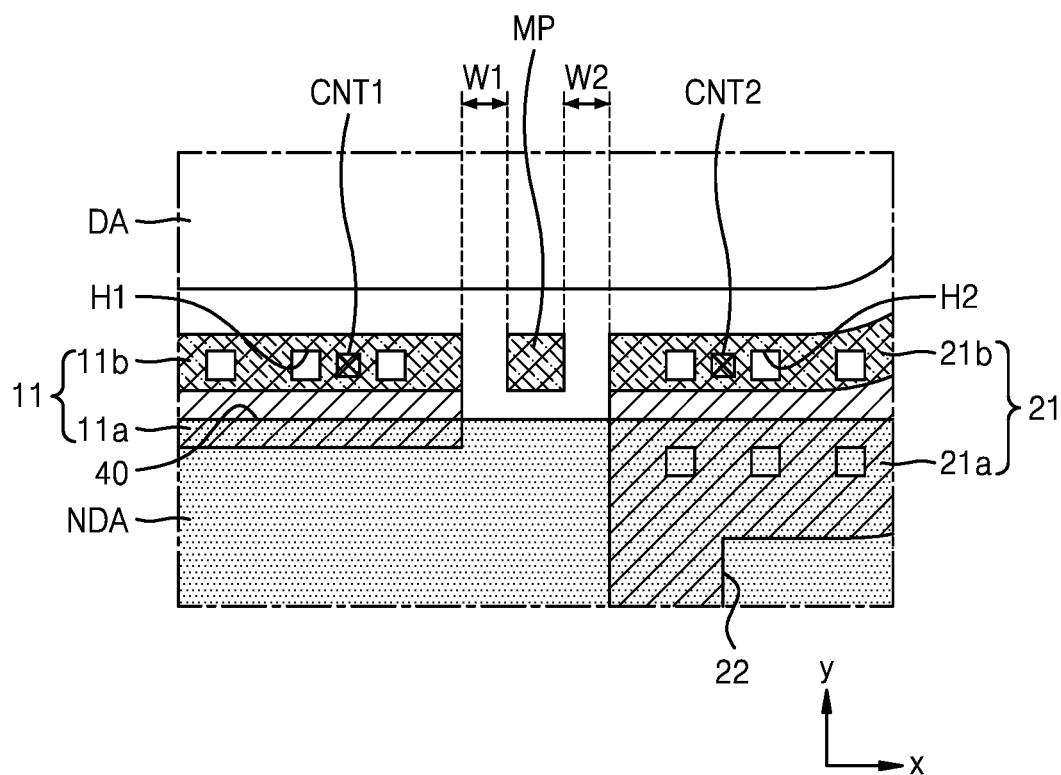
FIG. 9 is an enlarged schematic view of region IX of FIG. 8.

FIG. 8 is a plan view schematically illustrating a display panel 100 and a cover film 40 of a display device according to another embodiment. FIG. 9 is an enlarged schematic view of region IX of FIG. 8. In FIGS. 8 and 9, like reference numerals in FIGS. 3 and 4 represent like elements and thus, a redundant description thereof will be omitted.

Referring to FIGS. 8 and 9, the display device may include a display area DA and a non-display area NDA that may surround the display area DA. A first voltage line 10 may be disposed in the non-display area NDA and may supply a first power supply voltage to each of pixels P disposed in the display area DA. At least part of the first voltage line 10 may overlap a first virtual straight line ST1 parallel with one side of the display area DA. The first voltage line 10 may include a first main voltage line 11 and a first connection line 12. The second voltage line 20 may be apart from the first voltage line 10 in the non-display area NDA and may supply a second power supply voltage to each pixel P disposed in the display area DA. The second voltage line 20 may include a second main voltage line 21 and a second connection line 22. A metallic pattern MP may be included between the first voltage line 10 and the second voltage line 20, and the metallic pattern MP may be disposed along the first straight line ST1. Also, the cover film 40 may be disposed in the non-display area NDA.

In an embodiment, the first voltage line 10 or the second voltage line 20 may include first and second holes H1 and H2. For example, the first voltage line 10 may include the first holes H1. Also, the second voltage line 20 may include the second holes H2. In another example, the first voltage line 10 may include the first holes H1, and the second voltage line 20 may not include holes. In another example, the first voltage line 10 may not include holes, and the second voltage line 20 may include the second holes H2. However, for convenience of explanation, the case where the first voltage line 10 includes the first holes H1 and the second voltage line 20 includes the second holes H2 will be described in detail.

The first holes H1 may be provided so that the amount of heat generated by the first voltage line 10 may be reduced. The second holes H2 may be provided so that the amount of heat generated by the second voltage line 20 may be reduced. Each of the first holes H1 and the second holes H2 may increase the heat area of the first voltage line 10 and the second voltage line 20. Thus, deterioration of organic light-emitting diodes disposed in the display area DA adjacent to the first voltage line 10 and the second voltage line 20 may be prevented.

In an embodiment, the first holes H1 may be disposed at regular intervals. In another embodiment, any one of the adjacent first holes H1 may be disposed by a different distance from another one of the adjacent first holes H1. A distance between the first holes H1 may differ according to the heating degree of the first voltage line 10.

In FIG. 9, the first holes H1 may be apart from the cover film 40. In an embodiment, the width of the first holes H1 may be equal to or less than about 50 µm. Thus, the user may not recognize external light or external light reflection due to the first holes H1. In another embodiment, the first holes H1 may overlap the cover film 40. In an embodiment, the width of the first holes H1 may be equal to or greater than about 50 µm. Because the first holes H1 may overlap the cover film 40, the user may not recognize external light or external light reflection.

In an embodiment, the first holes H1 may have the same size. In another embodiment, any one of the first holes H1 may be provided with a different size from another one of the first holes H1. The sizes of the first holes H1 may differ according to the heating degree of the first voltage line 10.

In an embodiment, the second holes H2 may be disposed at regular intervals. In another embodiment, any one of the adjacent second holes H2 may be disposed by a different distance from another one of the adjacent second holes H2. The distance between the second holes H2 may differ according to the heating degree of the second voltage line 20.

In an embodiment, the second holes H2 may have the same size. In another embodiment, any one of the second holes H2 may be provided with a different size from another one of the second holes H2. For example, the width of the second holes H2 that are apart from the cover film 40 may be equal to or less than about 50 µm. The user may not recognize external light or external light reflection due to the second holes H2. The width of the second holes H2 that may overlap the cover film 40 may be equal to or greater than 50 µm. Because the second holes H2 may overlap the cover film 40, the user may not recognize external light or external light reflection. Also, the sizes of the second holes H2 may differ according to the heating degree of the second voltage line 20.

As described above, in one or more embodiments of the disclosure, a brighter screen may be realized, and a metallic pattern may be disposed between a first voltage line and a second voltage line so that sparkles that may be caused by external light or external light reflection in a non-display area may be minimized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
   a substrate comprising a display area and a non-display area adjacent to the display area;
   a pixel disposed in the display area;

a first voltage line disposed in the non-display area and supplying a first power supply voltage to the pixel;

a second voltage line disposed in the non-display area and supplying a second power supply voltage to the pixel, the second voltage line being apart from the first voltage line; and a metallic pattern disposed between the first voltage line and the second voltage line so as to reduce an effect caused by external light reflection in the non-display area, wherein a shortest distance between the first voltage line and the second voltage line is greater than a width of the metallic pattern.

2. The display device of claim 1, wherein a distance between the first voltage line and the metallic pattern is about 1 μm to about 50 μm.

3. The display device of claim 1, wherein a distance between the second voltage line and the metallic pattern is about 1 μm to about 50 μm.

4. The display device of claim 1, wherein at least part of the first voltage line overlaps a first virtual line parallel with a side of the display area, and the second voltage line surrounds at least part of the display area.

5. The display device of claim 4, wherein a width of the first voltage line is less than a width of the second voltage line.

6. The display device of claim 4, wherein the first voltage line is electrically connected to a first driving voltage line in a first direction in the display area and a second driving voltage line in a second direction crossing the first driving voltage line.

7. The display device of claim 1, wherein the first voltage line comprises a first lower voltage line and a first upper voltage line on the first lower voltage line.

8. The display device of claim 7, wherein the metallic pattern and the first lower voltage line or the first upper voltage line are disposed on a same layer.

9. The display device of claim 7, wherein the metallic pattern comprises a lower metallic pattern and an upper metallic pattern, the lower metallic pattern and the first lower voltage line are disposed on a same layer, and the upper metallic pattern and the first upper voltage line are disposed on a same layer.

10. The display device of claim 7, wherein the first lower voltage line and the first upper voltage line are electrically connected to each other via a contact hole of an insulating layer between the first lower voltage line and the first upper voltage line.

11. The display device of claim 1, further comprising a cover film in the non-display area.

12. The display device of claim 11, wherein the cover film overlaps the first voltage line or the second voltage line.

13. The display device of claim 11, wherein the cover film is apart from the metallic pattern in a direction in which the cover film is disposed from the display area.

14. The display device of claim 11, wherein the metallic pattern is disposed between the cover film and the display area.

15. The display device of claim 1, wherein the first voltage line or the second voltage line comprises holes.

16. A display device comprising:

a substrate comprising a display area and a non-display area adjacent to the display area;

a cover film in the non-display area, the cover film being made of a light-absorbing material:

a pixel disposed in the display area;

a first voltage line disposed between the substrate and the cover film and electrically connected to the pixel, wherein at least part of the first voltage line overlaps a first virtual line parallel with a side of the display area;

a second voltage line disposed between the substrate and the cover film and electrically connected to the pixel, the second voltage line being apart from the first voltage line; and a metallic pattern disposed between the first voltage line and the second voltage line so as to reduce an effect caused by external light reflection in the non-display area, wherein the metallic pattern is disposed along the first virtual line, wherein the metallic pattern is spaced apart from the first voltage line in a plan view, and the metallic pattern is spaced apart from the second voltage line in a plan view.

17. The display device of claim 16, wherein the metallic pattern is disposed between the display area and the cover film.

18. The display device of claim 16, wherein a distance between the first voltage line or the second voltage line and the metallic pattern is about 1 μm to about 50 μm.

19. The display device of claim 16, wherein the second voltage line extends along outer portions of the display area, and a width of the first voltage line is less than a width of the second voltage line.

20. The display device of claim 16, wherein at least one of the first voltage line and the second voltage line includes heat dissipation holes.

* * * * *